(12) United States Patent
Menke

(10) Patent No.: US 6,417,660 B2
(45) Date of Patent: *Jul. 9, 2002

(54) METHOD TO OBTAIN A TEMPERATURE COEFFICIENT-COMPENSATED OUTPUT SIGNAL IN AN OPTICAL CURRENT MEASURING SENSOR

(75) Inventor: Peter Menke, Erlangen (DE)

(73) Assignee: Siemens Aktiengesellschaft, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/269,236
(22) PCT Filed: Aug. 26, 1997
(86) PCT No.: PCT/DE97/01854
    § 371 (c)(1),
    (2), (4) Date: Mar. 22, 1999
(87) PCT Pub. No.: WO98/12570
    PCT Pub. Date: Mar. 26, 1998

(30) Foreign Application Priority Data

Sep. 20, 1996 (DE) .......................... 196 38 644

(51) Int. Cl.$^7$ .............................................. G01R 31/00
(52) U.S. Cl. ...................... 324/96; 324/117 R; 324/750
(58) Field of Search ............................... 324/96, 117 R, 324/244.1, 752, 750, 751; 250/231.1, 225, 227, 310, 311; 356/365, 367–368

(56) References Cited

U.S. PATENT DOCUMENTS

| 4,973,899 | A |   | 11/1990 | Jones et al. |         |
|-----------|---|---|---------|--------------|---------|
| 5,656,934 | A | * | 8/1997  | Bosselmann   | 324/96  |
| 5,764,046 | A | * | 6/1998  | Bosselmann   | 324/96  |
| 5,811,964 | A | * | 9/1998  | Bosselmann et al. | 324/96 |

FOREIGN PATENT DOCUMENTS

| DE | 195 17 128 A1 | 11/1996 |
| EP | 0 088 419     | 9/1983  |

OTHER PUBLICATIONS

Japanese Abstract, Publication No. 08178968, Dec. 7, 1996.
Japanese Abstract, Publication No. 07146346, Jun. 6, 1995.

* cited by examiner

Primary Examiner—Vinh P. Nguyen
(74) Attorney, Agent, or Firm—Schiff Hardin & Waite

(57) ABSTRACT

In a magneto-optical sensor with −/+ intensity norming, the temperature-coefficient-compensated output signal (S) is obtained by formation of a quotient of the alternating portion ($P_{AC}$) of the intensity-normed signal (P) and a function ($f(P_{DC}, P_{ACeff})$), determined by a calibration measurement, of a direct portion ($P_{DC}$) of the intensity-normed signal (P) and of a root-mean-square value ($P_{ACeff}$) of the alternating portion ($P_{AC}$). A corresponding method for sensors with AC/DC intensity norming is indicated.

4 Claims, 3 Drawing Sheets

METHOD TO OBTAIN A TEMPERATURE COEFFICIENT-COMPENSATED OUTPUT SIGNAL IN AN OPTICAL CURRENT MEASURING SENSOR

This application is a 371 of PCT/de97/01854, filed Aug. 26, 1997.

BACKGROUND OF THE INVENTION

1. Field of the Invention

The present invention relates to a method for obtaining a temperature-coefficient-compensated output signal in an optical sensor for measuring a periodically fluctuating electrical and/or magnetic field strength.

2. Description of the Related Art

Optical sensors of the cited type are known, in particular in the form of current measurement sensors for measuring the current strength of an alternating current conducted in a conductor, which produces in the immediate environment of the conductor an electromagnetic field with an electrical and magnetic field strength that fluctuates periodically corresponding to the current strength of the alternating current. The sensor measures, for example according to the Faraday effect, the periodically fluctuating magnetic field strength, according to which the current strength can be inferred.

Voltage measurement sensors operate in a similar manner for the measurement of an alternating voltage applied to a conductor, which voltage produces in the immediate environment of the conductor an electrical field with an electrical field strength that fluctuates periodically corresponding to the alternating voltage. This sensor measures, for example according to the Pockels effect, the periodically fluctuating electrical field strength, according to which the alternating voltage can be inferred.

The respective field strength is measured in that light that can be influenced by the field strength is sent through the periodically fluctuating field, and from this light that has been sent through and influenced two intensity signals are produced that are separate from one another and that comprise intensities containing intensity portions that fluctuate in chronologically periodic fashion in phase opposition to one another dependent on the field strength of the periodically fluctuating field.

The influencing of the light by the field can be based on various known physical effects, for example the cited Faraday or Pockels effect. As an example, the Faraday effect, which is frequently used in current measurement sensors, is explained in more detail, in which linearly polarized light from a polarizer is influenced by the magnetic field strength in such a way that the polarization plane of the polarized light is rotated, dependent on the field strength, in relation to the polarization plane determined by the polarizer, or in correspondingly periodically fluctuating fashion in the case of the periodically fluctuating field strength. The linearly polarized light which has been influenced by the magnetic field strength can be supplied to an analyzer, which forms two polarized light portions that are perpendicular to one another from this light, whose intensities relative to one another depend, in phase opposition, on the polarization state of the field-strength-influenced light in relation to the polarization plane determined by the polarizer, and which supplement each other to form an overall intensity that is independent of the angular position of the polarization plane of the field-strength-influenced light. In this case, these light portions form the two intensity signals that indicate the periodically fluctuating field strength [sic].

Such intensity signals can be obtained in a similar manner in voltage measurement sensors which for example exploit the Pockels effect.

With the aid of the variable derived from the two intensity signals, which corresponds to the quotient of the difference of the intensities of the two intensity signals and the sum of these intensities and that includes the direct portion and the periodically fluctuating alternating portion, to which a root-mean-square value can be allocated, the output signal of such a sensor, indicating the measured field strength and therewith the current strength or voltage, is obtained.

This output signal, in particular a periodically fluctuating portion contained therein, often exhibits a temperature drift whose cause is grounded in the physical effect on which the measurement is based, and/or in disturbances such as for example mechanical stresses and/or a linear double refraction.

In order to remove this problem, for example a temperature coefficient compensation method is proposed in relation to a magneto-optical sensor based on the Faraday effect, in which the two intensity signals are obtained in the manner described above with the aid of linearly polarized light from a polarizer, for example a laser diode, and an optical analyzer. In this known temperature compensation method, it is necessary to adjust the polarizer and analyzer very precisely to one another with respect to their angular setting, i.e., in such a way that the polarization plane determined by the polarizer and the polarization plane determined by the analyzer stand as precisely as possible at an angle of 45° to one another.

SUMMARY OF THE INVENTION

The present invention provides a new type of method for obtaining a temperature-coefficient-compensated output signal, having the advantage that in a sensor of the cited type, if the two intensity signals are obtained with the aid of a polarizer and analyzer, larger angular misadjustments are permissible between the polarizer and the analyzer in comparison to the known temperature compensation method.

The method, in which the quantity is derived from the two intensity signals, which quantity corresponds to a quotient of a difference of the intensities of the two intensity signals and the sum of these intensities, is known as −/+ intensity norming.

The basic idea of the invention underlying the inventive method permits, but is not limited to, this intensity norming, but rather can also be applied analogously to sensors in which what is known as AC/DC intensity norming is present, i.e., in sensors.

The invention likewise provides a new type of method for obtaining a temperature-coefficient-compensated output signal, with the advantage that in a sensor of the named type, if the two intensity signals are obtained with the aid of a polarizer and analyzer, greater angular misadjustments are permissible between the polarizer and the analyzer in comparison to the known temperature compensation method.

In the inventive method, angular misadjustments between the polarizer and the analyzer of more than 5° advantageously adversely affect the function of the inventive method only inessentially in the sensor itself. The reduction of sensitivity is low and is proportional to the cosine of the faulty angle between the polarization plane of the polarizer and that of the analyzer. This advantageously simplifies the design and manufacture of the sensor in which the inventive method is applied.

However, the inventive method is not limited to sensors that operate with polarizer and analyzer, but rather can generally be applied also in other sensors, and in this way extends the technology.

The function to be used in the inventive method and predetermined by the calibration measurement can be approximated by a polynomial of a predeterminable degree and/or can be stored in approximate form in a lookup table.

A preferred arrangement for the execution of a method for obtaining a temperature-coefficient-compensated output signal in an optical sensor for measuring a periodically fluctuating electrical and/or magnetic field strength, in which sensor light that can be influenced by the field strength is sent through the periodically fluctuating field strength, from this light that has been sent through and influenced, two intensity signals are produced that are separate from one another and that comprise intensities containing intensity portions that fluctuate in chronologically periodic fashion in phase opposition to one another dependent on the periodically fluctuating field strength, and a quantity is derived from the two intensity signals, which quantity corresponds to a quotient of a difference of the intensities of the two intensity signals and the sum of these intensities, whereby the quantity comprises a direct portion and a periodically fluctuating alternating portion with a root-mean-square value, in that the temperature-coefficient-compensated output signal is obtained by formation of a quotient of the alternating portion of the derived quantity and a function, determined by a calibration measurement, of the direct portion and of a root-mean-square value of the alternating portion of the derived quantity, this being executed by a means for obtaining the direct portion of the derived quantity, a means for obtaining the alternating portion of the derived quantity and formation of the root-mean-square value of this portion, and a means for forming the quotient of the direct portion of the derived quantity and the function) of the direct portion and of the root-mean-square value of the alternating portion of the derived quantity. A preferred arrangement for the execution of a method for obtaining a temperature-coefficient-compensated output signal in an optical sensor for measuring a periodically fluctuating electrical and/or magnetic field strength, in which sensor light is sent through the periodically fluctuating field strength, from this light that has been sent through, two intensity signals are produced comprising intensities that contain alternating portions that fluctuate periodically in phase opposition to one another dependent on the periodically fluctuating field strength and that contain a respective direct portion, and a respective normed quantity is derived from each of the two intensity signals, which normed quantity corresponds to a quotient of the alternating portion and the direct portion of the intensity of this intensity signal, in that from the two derived quantities a first quotient is derived from the sum and a difference of the two normed quantities, a periodically fluctuating second quotient is derived from the twofold product and the difference of the two normed quantities, and the temperature-coefficient-compensated output signal is obtained by formation of a quotient of the periodically fluctuating second quotient and a function, determined by a calibration measurement, of the first quotient and of a root-mean-square value of the periodically fluctuating second quotient, this being executed by a means for formation of the first quotient from the sum and the difference of the two derived normed quantities, a means for formation of the periodically fluctuating second quotient of the twofold product and the difference of the two derived normed quantities and of the root-mean-square value of the second quotient, a means for formation of the quotient of the formed periodically fluctuating second quotient and the function, determined by the calibration measurement, of the formed first quotient and of a root-mean-square value of the periodically fluctuating second quotient.

BRIEF DESCRIPTION OF THE DRAWINGS

In the following specification, the invention is explained in more detail by way of example on the basis of the figures.

DETAILED DESCRIPTION OF THE PREFERRED EMBODIMENTS

Figure 1:
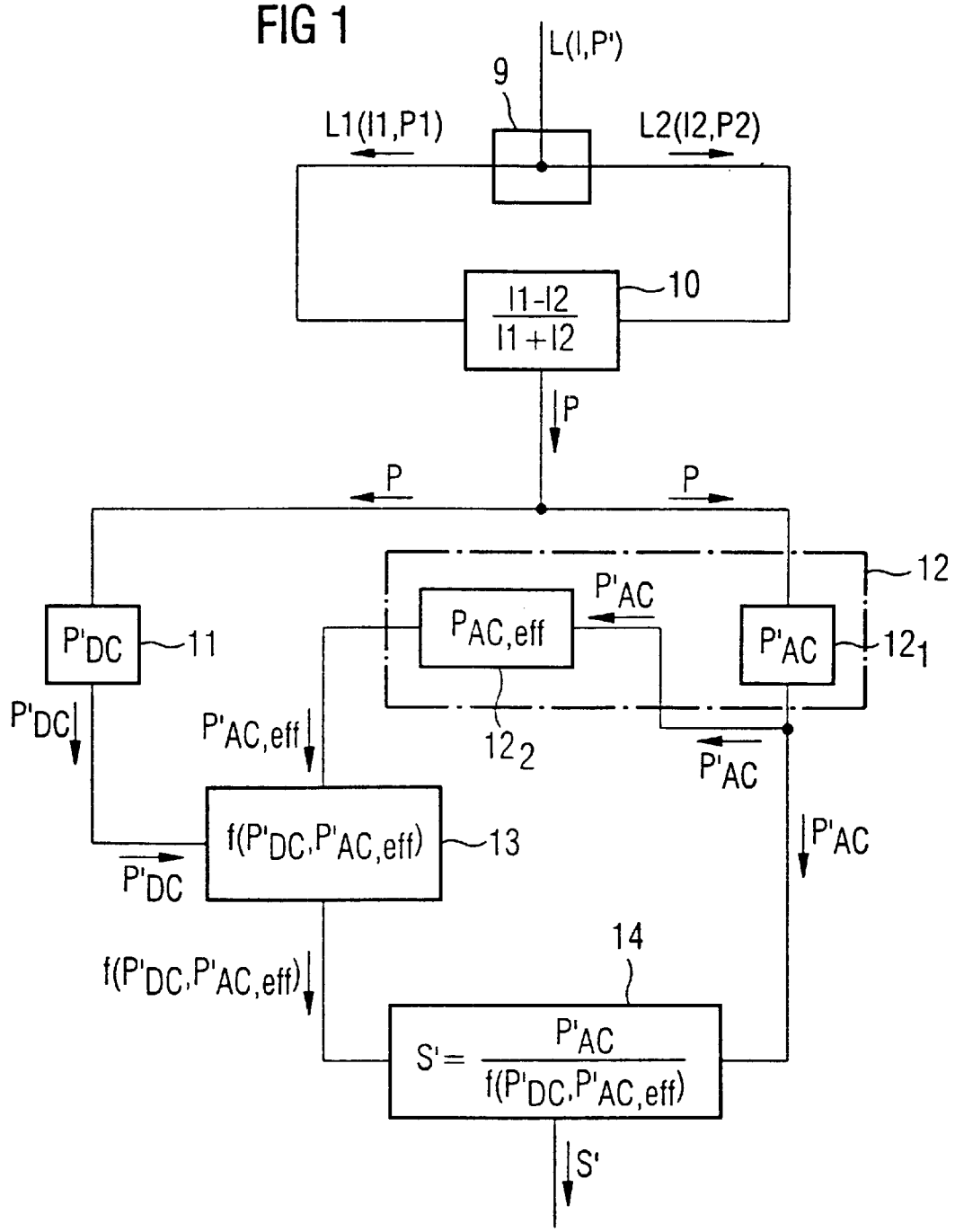
FIG. 1 shows, in a schematic representation, an output part, which produces the two intensity signals and the quantity derived therefrom, of an optical sensor with −/+ intensity norming, and an arrangement, coupled to this output part, for the execution of the method for obtaining a temperature-coefficient-compensated output signal in this sensor.
Figure 2:
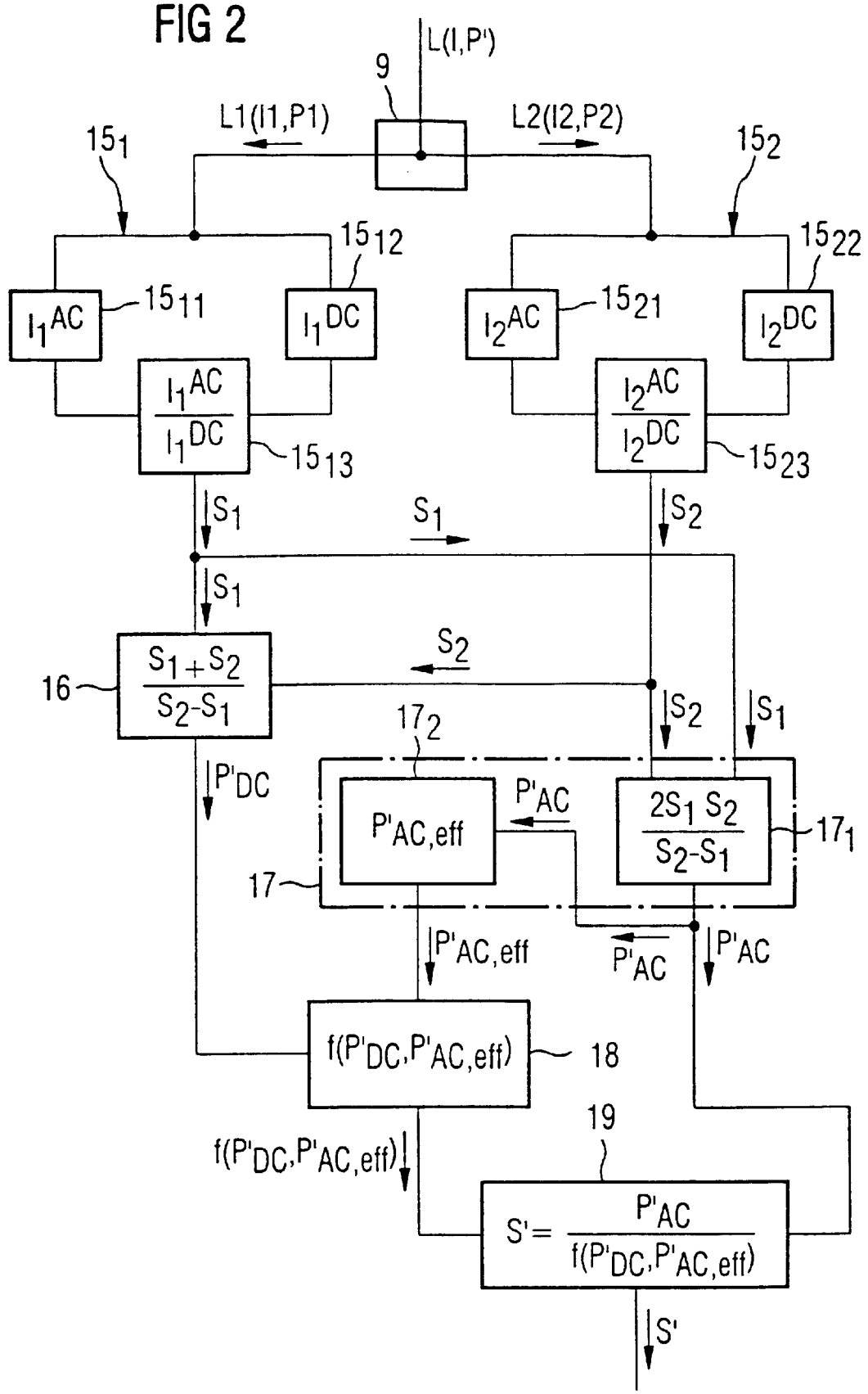
FIG. 2 shows, in a schematic representation, an output part, which produces the two intensity signals and the two normed quantities derived therefrom, of an optical sensor with AC/DC intensity norming, and an arrangement, coupled to this output part, for execution of a method for obtaining a temperature-coefficient-compensated output signal in this sensor.

In the examples according to FIGS. 1 and 2, it is assumed that the optical sensor is a magneto-optical or electro-optical sensor, as described in more detail above, which measures the periodically fluctuating magnetic and/or electrical field strength of a magnetic and/or electrical field produced by a current or a voltage, e.g. exploiting the Faraday or Pockels effect.

Light L with a particular polarization p, produced by a polarizer (not shown), is sent through the periodically fluctuating field, which influences the polarization dependent on the magnetic or electrical field strength in such a way that after passing through the field the light L comprises a polarization p' that is modified in relation to the particular polarization produced by the polarizer. Because the magnetic or electrical field or, respectively, the field strength thereof periodically fluctuates, the polarization p' of the polarized light that has passed through this field also fluctuates periodically in relation to the polarization determined by the polarizer.

In the following, let it be assumed without limitation of generality that the sensor is a current measurement sensor exploiting the Faraday effect. In this case, the polarizer (not shown) produces light L with a determined linear polarization p, which is sent through an optical medium with a Verdet constant arranged in the periodically fluctuating magnetic field, for example a glass fiber coil surrounding a current-conducting conductor.

The periodically fluctuating magnetic field influences the linearly polarized light L in such a way that after passage through the field the linear polarization p' periodically fluctuates in relation to the determined linear polarization. The light L [...] fluctuating polarization p' is supplied to an analyzer 9 with a polarization plane that is set as precisely as possible at an angle of 45° to the polarization plane of the determined polarization p of the linearly polarized light L produced by the polarizer, for example a laser diode.

From the light L with the fluctuating linear polarization p', the analyzer 9 produces an intensity signal L with a linear polarization p1 with a fixed polarization plane and an intensity I1, containing an intensity portion that fluctuates periodically dependent on the periodically fluctuating field strength, and an intensity signal L2 of a linear polarization p2 with a fixed polarization plane perpendicular to the fixed polarization plane of the intensity signal L1 and with an intensity I2 that contains an intensity portion that fluctuates periodically dependent on the periodically fluctuating field strength, whereby the periodically fluctuating intensity portions of intensities I1 or, respectively, I2 of the two intensity signals L1 and L2 fluctuate periodically in phase opposition to one another, dependent on the periodically fluctuating field strength.

An example of such an analyzer 10 is for example a Wollaston prism, which is often used in such current measurement sensors.

In the example according to FIG. 1, the quantity P is derived from the two intensity signals L1 and L2, corresponding to a quotient of, for example, the difference I1−I2 of the intensities I1 and I2 of the two intensity signals L1 and L2 and the sum I1+I2 of these two intensity signals I1 and I2.

For the formation of this derived quantity P=(I1−I2)/(I1+I2), the means 10 in FIG. 1 is provided, which preferably comprises a digital processor and digitally processes the supplied intensity signals L1 and L2, although an analog processing is equally possible.

The derived quantity P characterizes the sensor as the sensor with −/+ intensity norming.

The derived quantity P naturally contains a direct portion $P_{DC}$ and an alternating portion $P_{AC}$ that fluctuates periodically corresponding to the magnetic field strength to which alternating portion a root-mean-square value $P_{ACeff}$ can be allocated.

For the inventive method in relation to the sensor with −/+ intensity norming, these quantities $P_{DC}$, $P_{AC}$ and $P_{ACeff}$ are decisive.

Accordingly, from the derived quantity P in the means 11 in FIG. 1 the direct portion $P_{DC}$ thereof can be obtained, while in the means 12 the alternating portion $P_{AC}$ of the derived quantity P is obtained and the root-mean-square value $P_{ACeff}$ of this portion $P_{AC}$ is formed. $P_{DC}$ can for example be obtained by means of low-pass filtering, and $P_{AC}$ can for example be obtained by high-pass filtering or formation of $P-P_{DC}$.

The means 12 can for example be fashioned in such a way that a means $12_1$ is provided that obtains the alternating portion $P_{AC}$ from the derived quantity P, which alternating portion is supplied to a separate means $12_2$, in which the root-mean-square value $P_{ACeff}$ is formed.

According to the invention, the temperature-coefficient-compensated output signal S is obtained by formation of the quotient $$S=P_{AC}/f(P_{DC}, P_{ACeff})$$

from the alternating portion $P_{AC}$ of the derived quantity P and the function f ($P_{DC}$, $P_{ACeff}$) determined by the calibration measurement in the desired temperature range, of the direct portion $P_{DC}$ and of the root-mean-square value $P_{ACeff}$ of the alternating portion $P_{AC}$ of the derived quantity P.

Given a digital signal processing, from the value at a particular sampling point of the direct portion $P_{DC}$ and of the root-mean-square value $P_{ACeff}$, the function value belonging to this sampling point of the predetermined function f($P_{DC}$, $P_{ACeff}$) is determined, and from this the value belonging to this sampling point of the output signal S is formed by formation of the quotient with the value belonging to this sampling point of the alternating portion $P_{AC}$ and the functional value belonging to this sampling point. This method can be repeated from sampling point to sampling point. For the formation of the functional value belonging to this sampling point, the means 13 is provided, to which the value belonging to this sampling point of the direct portion $P_{DC}$ and the root-mean-square value $P_{ACeff}$ belonging to this sampling point are supplied, and which outputs to the means 14 the functional value, belonging to this value of the direct portion $P_{DC}$ and to this root-mean-square value $P_{ACeff}$ of the predetermined function f ($P_{DC}$, $P_{ACeff}$), as the functional value belonging to this sampling point of this function, to which means 14 on the other hand the value belonging to this sampling point of the alternating portion $P_{AC}$ is supplied and which forms and outputs from this functional value and this value of the alternating portion $P_{AC}$ the temperature-coefficient-compensated output signal S belonging to this sampling point.

The means 13 can contain a lookup table in which a functional value of the function f is respectively allocated to each pair of values consisting of a value of the direct portion $P_{DC}$ and a root-mean-square value PAceff of the alternating portion $P_{AC}$. The means 13 can also contain a processor that calculates the functional values of the function f allocated to the various value pairs from a value of the direct portion $P_{DC}$ and a root-mean-square value $P_{ACeff}$, e.g. in approximated fashion with the aid of a polynomial of a selectable order.

The value of the direct portion $P_{DC}$ and of the root-mean-square value $P_{ACeff}$ do not respectively change over a longer time period in comparison to the value of the alternating portion $P_{AC}$, so that in this respective time period these values can be regarded as constant, and do not need to be determined as often as the value of the alternating portion $P_{AC}$.

The example according to FIG. 2 is based on a sensor with AC/DC intensity norming. In this sensor, according to the invention a normed quantity $S_1$ or, respectively, $S_2$ is respectively derived from each intensity signal L1 and L2 from the analyzer 9. The normed quantity $S_1$ derived from the intensity signal L1 corresponds to the quotient $I^{AC}_1/I^{DC}_1$ of the alternating portion $I^{AC}_1$ and the direct portion $I^{DC}_1$ of the intensity I1 of the intensity signal L1, and the quantity S2 corresponds to the quotient $I^{AC}_2/I^{DC}_2$ of the alternating portion $I^{AC}_2$ and the direct portion $I^{DC}_2$ of the intensity I2 of the intensity signal L2.

In the example according to FIG. 2, the normed quantity $S_1$ is formed by the means $15_1$, which comprises for example a means $15_{11}$ for obtaining the alternating portion $I^{AC}{}_1$, a means $15_{12}$ for obtaining the direct portion $I^{DC}{}_1$ of the intensity signal L1, and a means $15_{13}$ for forming the quotient $I^{AC}{}_1/I^{DC}{}_1$. The normed quantity $S_2$ is formed by the means $15_2$, which comprises for example a means $15_{21}$ for obtaining the alternating portion $I^{AC}{}_2$ of the intensity signal L2, a means $15_{22}$ for obtaining the direct portion $I^{DC}{}_2$ of the intensity signal L2 and a means $15_{23}$ for forming the quotient $I^{AC}{}_2/I^{DC}{}_2$.

According to the invention, from the two derived quantities $S_1$ and $S_2$ the first quotient $P'_{DC}$ is derived from the sum $S_1+S_2$ and the difference $S_2-S_1$ of the two normed quantities $S_1$ and $S_2$, i.e., $P'_{DC}=(S_1+S_2)/(S_2-S_1)$, and the periodically fluctuating second quotient $P_{AC}$ is derived from the twofold product $2S_1S_2$ and the difference $S_2-S_1$ of the two normed quantities $S_1$ and $S_2$, i.e. $P'_{AC}=2S_1S_2/(S_2-S_1)$, and the temperature-coefficient-compensated output signal S is obtained by formation of the quotient $P'_{AC}/f(P'_{DC}, P'_{ACeff})$ of the periodically fluctuating second quotient $P'_{AC}$ and the function $f(P'_{DC}/ P'_{ACeff})$, determined by the calibration measurement, of the first quotient $P'_{DC}$ and of the root-mean-square value $P'_{ACeff}$ of the periodically fluctuating second quotient $P'_{AC}$.

The first quotient $P'_{DC}$ corresponds to the direct portion $P_{DC}$ of the derived quantity P according to FIG. 1, and the periodically fluctuating quotient $P'_{AC}$ corresponds to the alternating portion $P_{AC}$ of this derived quantity P.

For the formation of the first quotient $P'_{DC}$, the means 16 according to FIG. 2 is provided, while the second quotient $P'_{AC}$ and the root-mean-square value $P_{ACeff}$ of this second quotient $P'_{AC}$ are formed by the means 17.

Similar to the means 12 in FIG. 1, the means 17 can for example consist of a means $17_1$, for the formation of the second quotient $P'_{AC}$ and of a means $17_2$ for the formation of the root-mean-square value $P'_{ACeff}$ of the second quotient $P'_{AC}$, whereby the second quotient $P'_{AC}$ is supplied to the means $17_2$.

The means 18 corresponds to the means 13 in FIG. 1, and the means 19 corresponds to the means 14 in FIG. 1.

This means that the means 18 is supplied with the value belonging to a sampling point of the first quotient $P'_{DC}$ and the root-mean-square value $P'_{ACeff}$ belonging to this sampling point of the second quotient $P'_{AC}$, and the means 18 outputs to the means 19 the functional value of the predetermined function $f(P'_{DC}, P'_{ACeff})$ belonging to this value of the first quotient $P'_{DC}$ to this root-mean-square value $P'_{ACeff}$ as the functional value of this function belonging to this sampling point, to which means 19 on the other hand the value belonging to this sampling point of the second quotient $P'_{AC}$ is supplied, and which forms from this functional value and this value of the second quotient $P'_{AC}$ the temperature-coefficient-compensated output signal S' belonging to this sampling point, and outputs this output signal.

The means 18 can contain a lookup table in which a function value of the function f is respectively allocated to each pair of values consisting of a value of the first quotient $P'_{DC}$ and a root-mean-square value $P'_{ACeff}$ of the second quotient $P'_{AC}$ The means 19 can also contain a processor that calculates the functional values of the function f allocated to the various value pairs of a value of the first quotient $P'_{DC}$ and a root-mean-square value $P'_{ACeff}$ of the second quotient $P'_{AC}$, for example approximated with the aid of a polynomial of a selectable order.

An essential feature of the inventive method is the inclusion also of the root-mean-square value PACeff of the alternating portion $P_{AC}$ or, respectively, of the root-mean-square value $P'_{ACeff}$ of the second quotient $P'_{AC}$, and not only of the direct portion $P_{DC}$ or, respectively, first quotient $P'_{DC}$.

As is known, given optical adjusting $P_{DC}$ is a good measure for the sensor head temperature and thus for its momentary current sensitivity or, respectively, voltage sensitivity, a misadjustment between the analyzer and the polarizer causes however a dependence of the direct portion $P_{DC}$ or, respectively, first quotient $P'_{DC}$ on the field strength, whereby the previous compensation of the temperature coefficient fails. In contrast, in the inventive compensation a field strength dependence of the direct portion $P_{DC}$ or, respectively, first quotient $P'_{DC}$ is taken into account, and the temperature coefficient compensation works even given poor adjustment between analyzer and polarizer.

Figure 3:
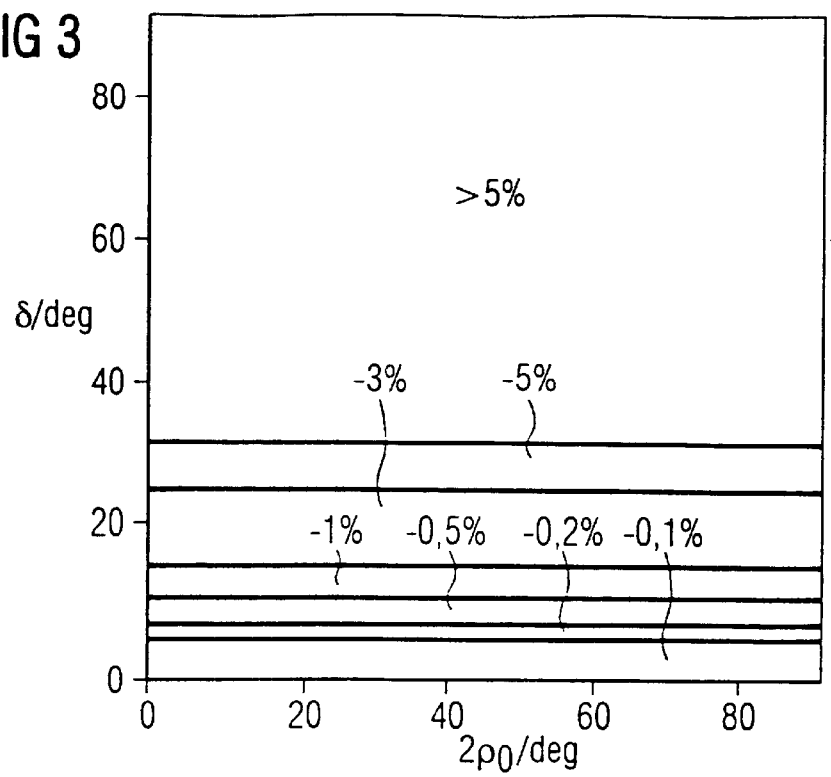
FIG. 3 shows a diagram which shows the percent deviation of the non-temperature-coefficient-compensated output signal of a magneto-optical sensor from its ideal value.

FIG. 3 shows, for example, the percent deviation of the non-temperature-coefficient-compensated derived quantity P according to FIG. 1 from its ideal value without linear double refraction δ, which likewise influences the light polarization and is caused by mechanical tensions, in particular given temperature fluctuations. The percent deviation is plotted against the circular double refraction 2ρ/°, which is directly proportional to the magnetic field strength, and against the linear double refraction δ/°, whose change with temperature essentially causes the temperature coefficient of the derived quantity P. If analyzer and polarizer are not adjusted precisely in relation to one another, the high measurement errors occurring here cannot be reduced by the application of the known temperature coefficient compensation methods. Given a de-adjustment of for example 5° between analyzer and polarizer, the compensated signal hardly differs from the uncompensated signal.

Figure 4:
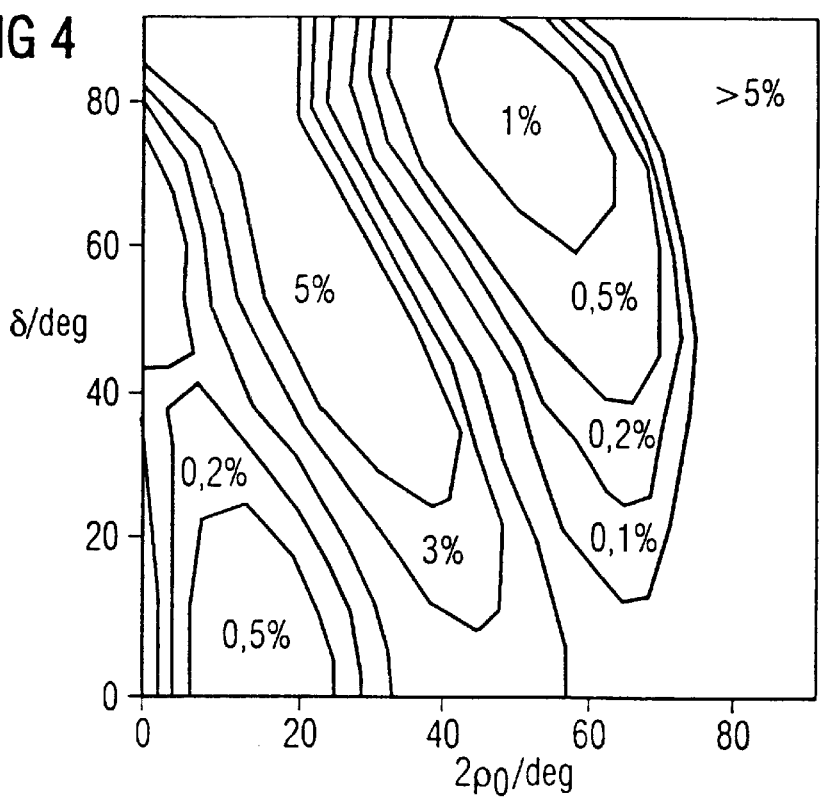
FIG. 4 shows a diagram showing the percent deviation of the output signal, corrected with the inventive method, of the magneto-optical sensor given an angular misadjustment of 5° between the analyzer and the polarizer.

FIG. 4 shows, in the same type of representation as FIG. 3, the percent deviation of the signal S or, respectively, S', corrected with the inventive method, from its ideal value without linear double refraction, given an angular misadjustment of 5° between analyzer and polarizer. A third-order polynomial was used for the function f, to be determined by means of calibration measurement. The percent error remains for the most part below 0.5%. The error actually to be expected during a measurement is much smaller, because it is not be expected that the linear double refraction δ will change with temperature over such a large range. Fluctuations of the Verdet constant, which is decisive for the Faraday effect, of the optical medium of the sensor with temperature are likewise compensated given determination of the adaptation function f by means of calibration measurement. The precision can be further increased by selection of an adaptation function f in the form of a polynomial of a still higher order.

Although other modifications and changes may be suggested by those skilled in the art, it is the intention of the inventors to embody within the patent warranted hereon all changes and modifications as reasonably and properly come within the scope of their contribution to the art.

I claim:

1. A method for obtaining a temperature-coefficient-compensated output signal in an optical sensor for measuring a periodically fluctuating electrical and/or magnetic field strength, comprising the steps of:

sending light that can be influenced by a field strength through the periodically fluctuating field strength, producing two intensity signals from said light that has been sent through and influenced in said sending step, said two intensity signals being separate from one another and being of intensities containing intensity portions that fluctuate in chronologically periodic fashion in phase opposition to one another dependent on the periodically fluctuating field strength, and deriving a quantity from the two intensity signals said quantity corresponding to a quotient of a difference of intensities of the two intensity signals and a sum of said intensities of said two intensity signals said quantity including a direct portion and a periodically fluctuating alternating portion with a root-mean-square value obtaining a temperature-coefficient-compensated output signal by formation of a quotient of the periodically fluctuating alternating portion of said quantity and a function determined by a calibration measurement of the direct portion and of a root-mean-square value of the periodically fluctuating alternating portion of said quantity.

2. A method according to claim 1, further comprising the steps of:

approximating the function determined by the calibration measurement by a polynomial of predeterminable degree.

3. A method according to claim 1, further comprising the steps of:

storing the function determined by the calibration measurement in approximated form in a lookup table.

4. An apparatus for obtaining a temperature-coefficient-compensated output signal in an optical sensor for measuring a periodically fluctuating electrical and/or magnetic field strength, comprising:

a means for obtaining a direct portion of a derived quantity, a means for obtaining an alternating portion of the derived quantity and formation of a root-mean-square value of said alternating portion, and a means for forming a quotient of the alternating portion of the derived quantity and a function of the direct portion and of the root-mean-square value of the alternating portion of the derived quantity.

* * * * *